(12) United States Patent
Schmidlin et al.

(10) Patent No.: US 10,127,173 B2
(45) Date of Patent: Nov. 13, 2018

(54) CONNECTION DEVICE

(71) Applicant: BELIMO Holding AG, Hinwil (CH)

(72) Inventors: Peter Schmidlin, Uster (CH); Silvio Grogg, Gossau (CH)

(73) Assignee: BELIMO HOLDING AG, Hinwil (CH)

(*) Notice: Subject to any disclaimer, the term of this patent is extended or adjusted under 35 U.S.C. 154(b) by 386 days.

(21) Appl. No.: 14/581,852

(22) Filed: Dec. 23, 2014

(65) Prior Publication Data

US 2016/0179732 A1 Jun. 23, 2016

(51) Int. Cl.
| | | |
|---|---|---|
| *H05K 7/00* | (2006.01) | |
| *G06F 13/40* | (2006.01) | |
| *G06F 13/42* | (2006.01) | |
| *G06F 13/364* | (2006.01) | |
| *H05K 1/18* | (2006.01) | |
| *H05K 1/16* | (2006.01) | |

(52) U.S. Cl.
CPC ........ *G06F 13/4068* (2013.01); *G06F 13/364* (2013.01); *G06F 13/4282* (2013.01); *G05B 2219/1204* (2013.01); *G05B 2219/2208* (2013.01); *H05K 1/16* (2013.01); *H05K 1/182* (2013.01); *H05K 2201/10045* (2013.01)

(58) Field of Classification Search
CPC ..................... H05K 1/16; H05K 1/182; H05K 2201/10045; G05B 2219/2208; G05B 2219/2209; G05B 2219/1204; G05B 2219/25011; G05B 2219/31146; G05B 2219/2614; H02J 3/14; Y10T 307/461; F24F 11/00; F24F 11/0009; F24F 11/001; F24F 11/006; F24F 11/0076; F24F 11/0079; F24F 11/0086; F24F 2011/0067; F24F 11/0012; F24F 11/053; Y02B 70/3275; Y04S 20/244; G05D 23/193; G05D 23/1932; G05D 23/1934
USPC ....... 361/748, 760, 761, 763, 764, 782, 783; 700/19, 20, 22, 275–285; 174/91, 92
See application file for complete search history.

(56) References Cited

U.S. PATENT DOCUMENTS

| | | | | |
|---|---|---|---|---|
| 5,568,344 A | * | 10/1996 | Gernhardt | H01H 83/04 361/115 |
| 7,391,607 B2 | * | 6/2008 | Minami | G06F 1/184 361/679.33 |
| 2007/0143543 A1 | * | 6/2007 | Lin | G06K 19/07732 711/115 |
| 2011/0295546 A1 | * | 12/2011 | Khazanov | G01P 1/023 702/141 |
| 2012/0048617 A1 | * | 3/2012 | Mihara | B60L 3/0069 174/77 R |
| 2013/0183862 A1 | * | 7/2013 | Ni | G06F 1/1632 439/620.22 |

* cited by examiner

*Primary Examiner* — Binh Tran
(74) *Attorney, Agent, or Firm* — Birch, Stewart, Kolasch & Birch, LLP

(57) ABSTRACT

A connecting device comprises housing, a board with electrical components, including at least one digital bus connection and an input/output section. It allows outsourcing of analog and digital I/O from a connected device, e.g. an HVAC actuator control unit by decentralizing inputs and outputs.

18 Claims, 2 Drawing Sheets

CONNECTION DEVICE

TECHNICAL FIELD

The invention is related to a connecting device, especially for Heat Ventilation Air Conditioning (HVAC) applications. It allows outsourcing of analogue and digital I/O from a connected device, e.g. an HVAC actuator control unit, by decentralizing input and outputs.

BACKGROUND ART

State of the art actuator devices as used in HVAC applications do not provide scalable input and outputs (I/O) which are necessary to build performant control systems for HVAC.

GB 2,431,303A discloses an EC motor control system which combines an EC Motor with a control unit, which is powered by the EC Motor. The control unit has sensor input channels and a network connection to a building management system. The combination of the EC motor and control allows driving a fan for the purpose of ventilation and climate control, by considering sensor inputs as temperature, pressure humidity or $CO_2$ content. However the system disclosed in GB 2,431,303A is not scalable.

GB 2,473,916A discloses a fan control system, which allows to arbitrarily adjust the number of input and outputs to the requirement of a control system, by adding I/O slaves to a digital bus system. This system allows building up complex control system and facilitates maintenance. However GB 2,473,916A does not disclose a connecting device which minimizes the installation effort and which is cost efficient.

SUMMARY OF THE INVENTION

It is the object of the invention to create a connecting device pertaining to the technical field initially mentioned, which allows the integration of different actuators and sensors into a control system, in order to perform a requested functionality, especially in the field of HVAC, with reduced cost and installation effort.

In HVAC there are many applications consisting of different actuators, sensors and at least one controller to perform a requested functionality. With the connecting device according to the invention it is possible to build complex systems around an intelligent damper or valve actuator by adding all the necessary IO in small packages.

A typical application could be Fan Coil Units.

The main tasks of the connecting device are A/D and D/A-conversions, but also providing DC power to peripheral devices.

The connecting device comprises a very simple and slim housing, being an integrated part of a cable with no metallic contacts.

The construction is such that it can be just considered as a broadening/thickening of a cable with no screw connections. The construction of the cable is very robust and minimizes installation effort as no screwing is necessary.

According to a preferred embodiment the connecting device comprises
1. a housing,
2. a board with electrical components, including
    2.1. a microcontroller (intelligent control unit) if required, in order to pre-process the signals in the sense of a decentralised intelligent device
    2.2. at least one digital bus connection,
        2.2.1. which is preferably a 3-wire digital bus connection comprising

| | |
|---|---|
| 2.2.1.1. | a signal wire |
| 2.2.1.2. | a power wire (preferably 24 V) |
| 2.2.1.3. | a GND wire. |

2.3. and an input/output section, comprising
        2.3.1. at least a digital or analogue input
        2.3.2. and/or a digital or analogue output, preferably:

| | |
|---|---|
| 2.3.2.1. | a 10 V output or 0-10 V output |
| 2.3.2.2. | a temperature input |
| 2.3.2.3. | a digital input |

2.3.3. or/and a digital gateway, wherein the gateway can be for instance

| | |
|---|---|
| 2.3.3.1. | Wireless gateway as Bluetooth, EnOcean, ZigBee and NFC |
| 2.3.3.2. | Wire based technology as BACNET, Modbus |
| 2.3.3.3. | Infrared gateway |

2.3.4. The input/output section may also include signal conditioning means (voltage converter, voltage to current converters).
3. The connection device may also comprise external memory, preferably scalable, allowing data logging.

The input/output section is usually application specific. The analogue or digital interface can be locally realized were they are needed, avoiding electromagnetic interference. A typical configuration comprises a 0-10 V output, a temperature input and a digital input.

Other advantageous embodiments and combinations of features come out from the detailed description below and the totality of the claims.

BRIEF DESCRIPTION OF THE DRAWINGS

The drawings used to explain the embodiments show:

FIG. 2a, 2b top and side view of a connecting device according to the invention with two I/O cables;

In the figures, the same components are given the same reference symbols.

PREFERRED EMBODIMENTS

Figure 1:
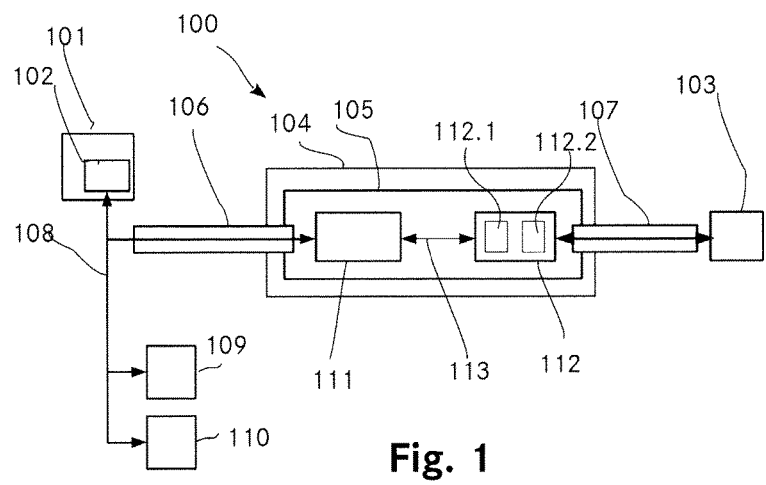
FIG. 1 schematic drawing of a connecting device according to the invention with one I/O cable.

FIG. 1 shows an example of a connecting device 100 according to the invention. In the field of Heat, Ventilation and Air Conditioning (HVAC) there are many applications consisting of different actuators, sensors and at least one controller to perform a requested functionality. With the connecting device 100 it is possible to build complex systems around an intelligent actuator such as for instance a damper or valve actuator.

The connecting device 100 allows adding external I/Os to the actuator device 101 and thus connecting it to a peripheral electrical device 103, which can be for instance a sensor or an actuator.

The connecting device comprises a housing 104, a circuit board 105 mounted inside the housing 104, a bus cable 106 and an I/O cable 107. The bus cable 106 connects the connecting device 100 via a digital bus 108 to a digital bus interface 102 of the electrical actuator 101. The electrical actuator 101 is configured as bus master whereas the connection device 100 is configured as bus slave. Further slave devices with a digital bus interfaces may be connected to the digital bus 108, such as a thermostat 109 for setting a reference value of the room temperature and an additional electric actuator 110, as for instance a fan.

The I/O cable 107 connects the connecting device to the peripheral electrical device 103. The signal transfer between the digital bus 106 and the I/Os of the peripheral electrical device 103 is achieved by means of the electrical circuit board 105, which comprises a bus controller 111, a signal conditioning unit 112 and an electrical connection 113 between the bus controller 111 and the signal conditioning unit 112. The bus controller 111 manages the communication with the other bus members (electrical actuator 101, thermostat 109 and fan 111) and translates the incoming and outgoing data in intermediate signals which are transferred via the electrical connection 113 to the signal conditioning unit 112. The signal conditioning unit 112 includes digital to analogue converters (DAC, 112.1) for converting digital output values of the bus controller 111 to analogue voltages or currents and analogue to digital converters (ADC, 112.2) for converting analogue input signals of the peripheral electrical device 103 to digital values. The conditioning unit 112 also comprises the driver circuits to physically adapt the I/Os such that they can be transmitted via the I/O cable 107 to the corresponding I/Os of the peripheral electrical device 103, respectively input circuits which are conditioning the input signals such that they can be digitized, for instance by low pass filtering. Driver circuits for digital input or output signals are also part of the signal conditioning unit 112, or for any other IOs, such as for instance temperature signals.

The packaging of the connecting device 100 includes the housing 104, preferable made out of a plastic material, a cable jacket surrounding the bus cable 106 and a cable jacket surrounding the I/O cable 107. The cable jacket surrounding the bus cable 106 and the cable jacket surrounding first I/O cable 107 are fixedly secured to the housing 104 of the connecting device 100, such that the connecting device 100 forms a functional cable which can be regarded as one single cabling unit. The attachment of the cables is for instance achieved by bonding, moulding, heat-sealing, and welding or by any other suitable method which allows a fix and preferably leak-proof connection between the cable jackets of the bus and the I/O cables 106, 107 and the housing 104 of the connecting device 100.

Thus the external I/O is packaged in a way that it does not necessarily need to be fixed by screws.

Figure 2A:
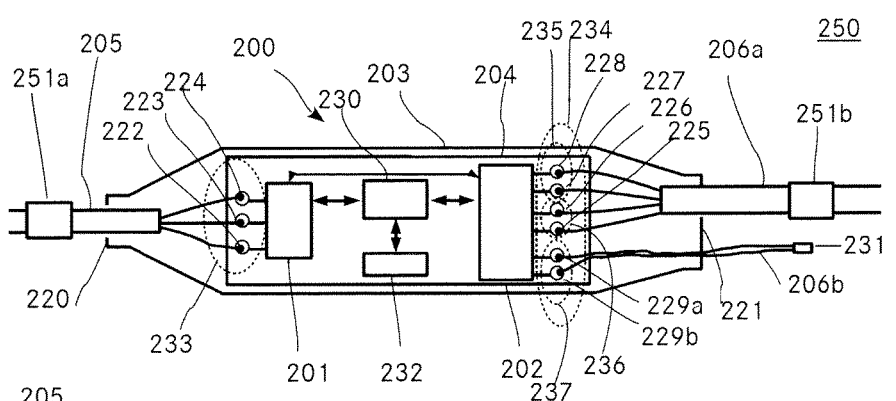
Figure 2B:
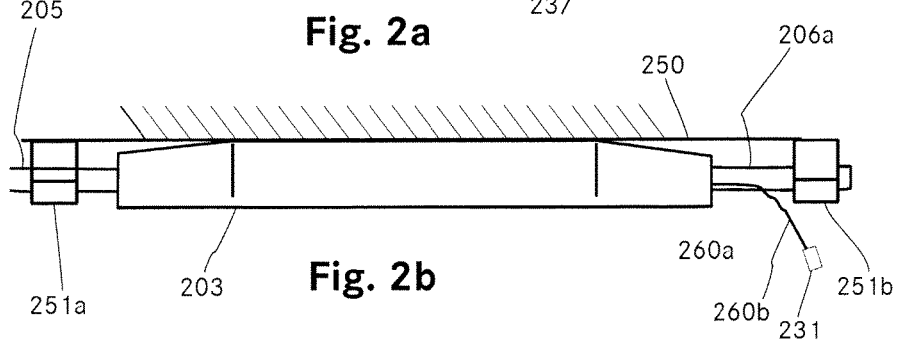

FIG. 2a shows a top view and FIG. 2b the corresponding side view of an embodiment of the connecting device 200 according to the invention. The housing 203 has an elongated rectangular form which is tapering on the small sides towards a first and a second face. The first face 220 comprises a cut-out for mounting the bus cable 205 for a 3-wire digital bus, whereas the second face 221, on the opposite side of the housing comprises two cut-outs for mounting a first I/O cable 206a and a second I/O cable 206b, which is in this example a temperature sensor cable connecting a temperature sensor 231 to the connecting device 200.

The housing 203 holds a printed electrical circuit board (PCB) 204 which is encapsulated inside the housing 204 with a synthetic resin (not shown), such that the electronic is protected against dirt and mechanical stress. As it is shown in FIG. 2a and FIG. 2b, the connecting device is fixed to an upper wall 250 of an air channel by two bracket clips 251a and 251b which are attached to the surface of the wall 250 of the air channel and clamp the bus cable 205 and the first I/O cable. As the connecting device is mounted on the upper wall, the temperature cable 206b with the temperature sensor 231 is simply hanging downwards into the air flow channel. The installation effort is thus reduced to a minimum, as the connecting device 200 can be handled similar to a cable.

The PCB provides three connection pins for the bus cable 205: A first connection pin for connecting the digital bus signal 222, a second connection pin for connecting the 24 V DC or AC supply voltage 223 and a third connection pin for connecting the reference Voltage 224. The digital bus connection 233 is represented by the three connection pins for the bus cable 205. The PCB further comprises four connection pins for connecting the first I/O cable 206a which in this examples provides an analogue 0 to 10 V output and a digital input: A first connection pin for connecting the 10 V analogue output voltage 225, a second connection pin for connecting the analogue ground 226, a third connection pin for connecting the digital input 227 and a fourth connection pin for connecting the digital reference 228. Furthermore it comprises two additional connection pins 229a and 229b for connecting the temperature sensor 231 such as a NTC or PTC with a two wire connection. The input/output section 234 includes an analogue output 235, a digital input 236 and an analogue input 237. The analogue output 235 is represented by the first connection pin for connecting the 10 V analogue output voltage 225 and the second connection pin for connecting the analogue ground 226. A digital input 236 is represented by the third connection pin for connecting the digital input 227, the fourth connection pin for connecting the digital reference 228 and an analogue input 237 by the connections pins 229a and 229b for connecting the temperature sensor 231.

The circuit board 204 includes also a bus controller 201 which manages the communication with other digital bus members and a signal conditioning unit 202 for conditioning the analogue 0 to 10 V output, respectively for converting the measured resistance of the NTC respectively PTC to a digital temperature value and to adapt the signal level of the digital input, for instance from a 24 V voltage level suitable for 5 V TTL logic.

The PCB 204 further comprises a microprocessor 230 for pre-processing the Input-/Output signals in the sense of a decentralized intelligence. In addition, a memory device is integrated on the PCB 204 which allows decentralized data monitoring and also allows the scaling of the system memory depending on the number of I/Os. The housing 203 is preferably made of a plastic material.

Figure 3:
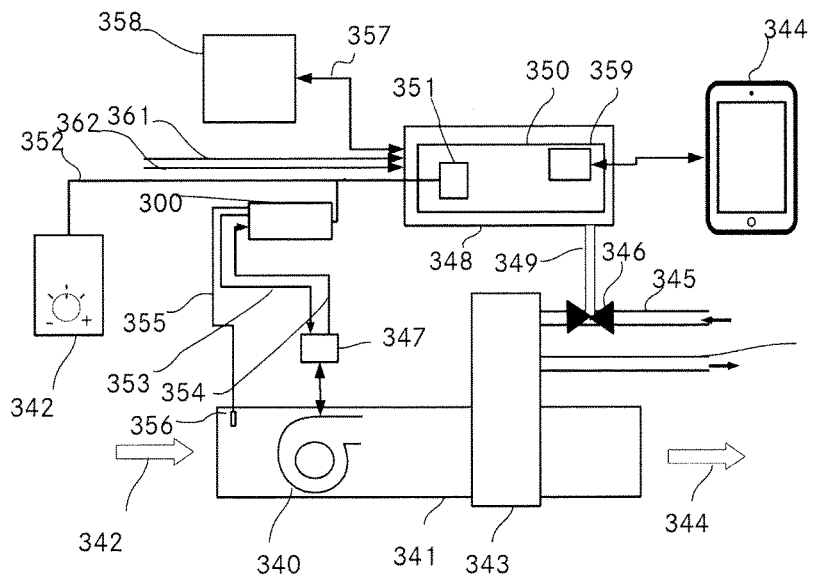
FIG. 3 schematic diagram of HVAC system with decentralized I/O using a connecting device according to the invention.

FIG. 3 shows a Fan Coil Unit as a typical example of an HVAC System integrating a connection device 300 according to the invention. The fan coil unit comprises a fan unit 340 which controls the air flow through an air duct 341. Recirculating air 342 enters the air duct 341 at one end before being accelerated by the fan unit 340. The accelerated air is cooled down when passing down-stream a cooling register before it leaves the air duct 341 as supply air 344 to a room (not shown). Cold water for the heat exchange is provided to the cooling register 343 via a water-pipe system 345. At the inflow part of the water pipe a controlled water valve 346 regulates the flow rate of the cold water. The room temperature of the room is regulated by the flow rate of the air and the flow rate of the cold water, respectively by means of the speed of the fan unit 340 and the position of the controlled water valve 346. The fan speed can be continuously adjusted by a 0-10 V speed reference signal, which is provided to the control electronics 347 of the fan unit 340, while the position of the water valve 346 is adjusted by means of an electrical valve actuator 348 which is connected to the controlled water valve 346 by means of an mechanical coupling 349. The electrical valve actuator also comprises a control unit 350 which not only includes the position controller of the electrical actuator 348 but also the fan coil controller and the bus master 351 of a sensor-actor-bus 352. The sensor-actor-bus system connects the electrical actuator 348 with a thermostat allowing the setting of a reference temperature 342 via the connecting device 300 according to the invention. The connecting device is decentralizing the further inputs and outputs of the fan coil control system from the control unit. It comprises a 0 to 10 V analogue output 353 for commanding the speed of the fan 340, a 24 V digital input 354 indicating an error of the fan 340, and a temperature input 355 which is connected to a temperature sensor 356, which measures the temperature of the supply air 342. The control unit 350 is further connected to a personal computer 358 respectively to a computer network via a Modbus-connection using the communications protocol for building automation and control networks (BACnet), but also other field-bus systems are possible. The personal computer 358 allows amongst other things the commissioning of the fan coil controller as well as the supervision of it. The control unit 350 further includes a communication unit 359, in particular a near field communication (NFC) unit which allows a wireless connection between a smart device 360 and the control unit 350. The smart device allows monitoring of actual input and output values of the fan coil control system, including for instance the reference speed of the fan drive, the set-point temperature, set by means of the thermostat 342, the actual temperature, measured by means of the temperature sensor 356 and the status of the field bus 357. The smart device also allows changing settings of the fan Coil Controller implanted in the control unit 350 or the field bus 352. The electrical actuator is further connected to a 24 V AC or DC Power supply by means a of a 24 V supply wire 361 and GND wire 362.

In summary, it is to be noted that in the examples shown in FIG. 1, FIG. 2a, FIG. 2b and FIG. 3 additional I/O cable can be added and thus the number of peripheral I/O increased. The I/O might be combined in any suitable way, preferable in small units between 1 and 4 I/O. It is also possible to add beside the analogue and digital I/O, gateways between the digital bus respective field bus (108, 205, 352) and other communication technologies.

Figure 4:
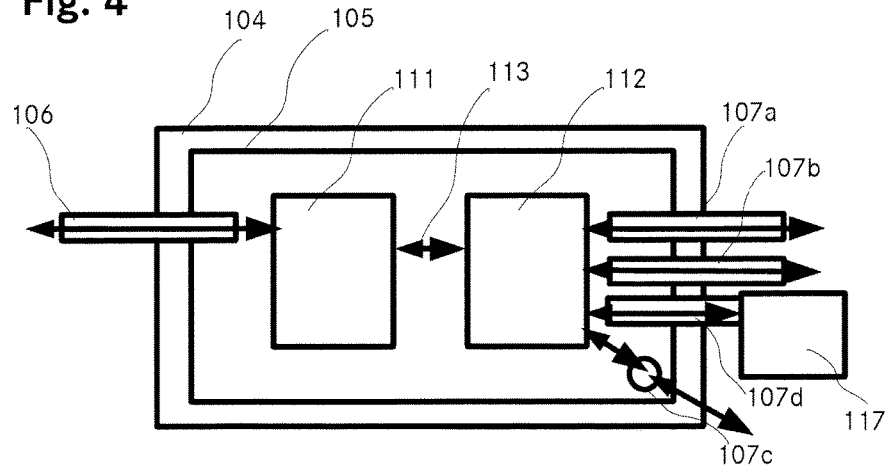
FIG. 4 schematic drawing of a connecting device according to the invention with multiple I/O cables, a wireless connection and an external storage module.

It is for instance possible to provide a gateway using the same bus protocol as it is used for the communication with the electrical drive actuator over the digital bus (108, 205, 352), and such to extend the digital bus and connect for instance further connecting devices 100, 200, 300. Also other communication technologies are possible, such as wireless technologies (107c in FIG. 4), as for instance Bluetooth, EnOcean, ZigBee or NFC or cable based technologies (107b in FIG. 4) as BACNet, Modbus, Profibus and Profinet, etc., or also infrared. It is further possible to provide other materials as plastic for the housing, as for instance aluminium or steel, which might be advantageous under harsh environmental conditions, or some especially fire resistant materials as ceramics for Fire damper applications. It is intended to provide connections (107d in FIG. 4) for external storage modules (117 in FIG. 4) for data logging, which can be scaled on request. It is further planned to provide supply power outputs for peripheral devices. Thought the system is specially adapted to HVAC application it also might be used in other fields where decentralized I/O might be advantageous, especially where installation effort needs to be reduced, as for instance in production equipment. The arrangement of the electronic components is not restricted on the placement of the components on one single circuit board. They might be split over different circuits or also be loosely arranged of adequate. The circuit board (105, 204) might also be a multi-layer circuit board.

LIST OF REFERENCE SYMBOLS

| | |
|---|---|
| 100 | Connecting device |
| 101 | Electrical actuator |
| 102 | Digital bus interface |
| 103 | peripheral electric device |
| 104 | Housing |
| 105 | Circuit board |
| 106 | Bus cable |
| 107,a,b,c | I/O cable |
| 107 d | Connection to the external storage module |
| 108 | Digital bus |
| 109 | thermostat |
| 110 | Electric motor |
| 111 | Bus controller |
| 112 | Signal conditioning unit |
| 113 | Electrical connection |
| 112.1 | DAC |
| 112.2 | ADC |
| 117 | External storage module |
| 200 | Connecting device |
| 201 | Bus controller |
| 202 | Signal conditioning unit |
| 203 | housing |
| 233 | Digital bus cable connection pins |
| 204 | Printed circuit board (PCB) |
| 220 | Bus face |
| 221 | I/O face |
| 222 | Bus signal |
| 223 | Supply voltage |
| 224 | Reference voltage |
| 225 | 10 V analogue output voltage |
| 226 | Analogue Ground |
| 227 | Digital output |
| 228 | Digital reference |
| 229a, 229b | Connection pins for temperature sensor |
| 230 | Microprocessor |
| 231 | Temperature Sensor |
| 232 | Memory device |
| 233 | digital bus connection |
| 234 | Input/output section |
| 235 | Analogue output |
| 236 | Digital input |
| 237 | Analogue input |
| 300 | Connecting device |
| 340 | Fan unit |
| 341 | Air duct |
| 342 | Recirculating air |
| 343 | Cooling register |
| 344 | Supply air |
| 345 | Water-pipe system |
| 346 | Controlled water valve |
| 347 | Control electronics of fan drive |
| 348 | Electrical valve actuator |
| 349 | Mechanical coupling |
| 350 | Control unit |
| 351 | Bus master |
| 352 | sensor-actor-bus system |
| 353 | 0 to 10 V analogue output |
| 354 | 24 V digital input |
| 355 | Temperature input |
| 356 | Temperature sensor |
| 357 | Field bus |

| | |
|---|---|
| 358 | Personal computer |
| 359 | Communication unit |
| 360 | Smart device |
| 361 | Supply wire |
| 362 | GND wire |

The invention claimed is:

1. A connecting device configured for HVAC applications, comprising:
   a) a housing;
   b) a board with electrical components, including at least one digital bus connection;
   c) an input/output section; and
   d) a bus cable and an I/O cable,
   e) wherein a cable jacket of the I/O cable and a cable jacket of the bus cable are fixedly attached to the housing, such that the connecting device, including the respective cable or the respective cables, forms a single cabling unit.

2. The connecting device according to claim 1, wherein the board includes a microprocessor in order to pre-process the signals in the sense of a decentralized intelligent device.

3. The connecting device according to claim 1, wherein the input/output section includes a gateway, and the gateway comprises at least one of the group consisting of a wireless gateway such as Bluetooth, EnOcean, ZigBee and NFC, a wire based technology such as BACNET, Modbus and an infrared gateway.

4. The connecting device according to claim 1, wherein the input/output section also includes signal conditioning means including one of voltage converters and voltage to current converters.

5. The connecting device according to claim 1, wherein at least one of the cable jacket of the I/O cable and a cable jacket of the bus cable is attached without screw connections to the housing, the attachments of the at least one of I/O cable and a cable jacket being a leak proof connection.

6. An HVAC system, comprising:
   a. a damper or valve actuator including a control unit with a digital bus interface;
   b. an electrical peripheral device including one of a sensor and an actuator;
   c. a connecting device including a housing, a board with electrical components, and a digital bus cable; and
   d. the board including at least one digital bus connection and an input/output section,
   e. wherein the digital bus cable connects the control unit of the damper or valve actuator to the digital bus connection of the board, and
   f. wherein the electrical peripheral device is connected to the input/output section.

7. The HVAC system according to claim 6, wherein a cable jacket of the bus cable is fixedly attached to the housing of the connecting device without screw connections to the housing, and the connection of the cable jacket of the bus cable to the housing is leak proof.

8. The HVAC system according to claim 7, wherein a cable jacket of the I/O cable is fixedly attached to the housing of the connecting device.

9. The HVAC system according to claim 8, wherein the cable jacket of the bus cable and the cable jacket of the I/O cable are fixedly attached to the housing of the connecting device.

10. The HVAC system according to claim 6, wherein the connecting device includes an I/O cable which connects the electrical peripheral device to the input/output section of the connection device.

11. The HVAC system according to claim 6, wherein the board is mounted inside the housing, the board being encapsulated insider the housing with a synthetic resin.

12. The HVAC system according to claim 6, wherein the housing has an elongated rectangular body.

13. The HVAC system according to claim 6, wherein the digital bus connection is a 3-wire digital bus connection including a signal wire, a power wire, and a ground wire.

14. The HVAC system according to claim 6, wherein the board includes a microprocessor in order to pre-process the signals in a sense of a decentralized intelligent device.

15. The HVAC system according to claim 6, wherein the input/output section includes at least one of a digital input, an analogue input, a digital output, an analogue output, and a digital gateway.

16. The HVAC system according to claim 15,
   wherein the digital bus cable provides a connection to a bus master,
   wherein at least one of a digital output, an analogue output, and a digital gateway is connected to a peripheral device, and
   wherein a signal can be transmitted from the bus master to a respective input of the peripheral device.

17. The HVAC system according to claim 15,
   wherein the digital bus cable provides a connection to a bus master,
   wherein at least one of the digital input, the analogue input, and the digital gateway is connected to the electrical peripheral device, and
   wherein a signal can be transmitted from a respective output of the electrical peripheral device to the bus master.

18. The HVAC system according to claim 6, wherein the connecting device comprises an external memory including a scalable memory allowing data logging.

* * * * *